US008884333B2

(12) United States Patent
Shibata et al.

(10) Patent No.: US 8,884,333 B2
(45) Date of Patent: Nov. 11, 2014

(54) NITRIDE SEMICONDUCTOR DEVICE (71) Applicant: Panasonic Corporation, Osaka (JP)

(72) Inventors: Daisuke Shibata, Kyoto (JP); Masahiro Hikita, Toyama (JP); Hidetoshi Ishida, Osaka (JP); Tetsuzo Ueda, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/265,192

(22) Filed: Apr. 29, 2014

(65) Prior Publication Data

US 2014/0231873 A1  Aug. 21, 2014

Related U.S. Application Data (60) Division of application No. 13/372,065, filed on Feb. 13, 2012, now Pat. No. 8,748,941, which is a continuation of application No. PCT/JP2010/002981, filed on Apr. 26, 2010.

(30) Foreign Application Priority Data

Sep. 3, 2009  (JP) ................. 2009-203978

(51) Int. Cl.
*H01L 29/66* (2006.01)
*H01L 29/778* (2006.01)

(52) U.S. Cl.
CPC ................. *H01L 29/7786* (2013.01)
USPC .................... 257/192; 257/E92.255

(58) Field of Classification Search
CPC .......................................... H01L 29/78
USPC .......................... 257/192, E29.255
See application file for complete search history.

(56) References Cited

U.S. PATENT DOCUMENTS

| 7,898,002 | B2* | 3/2011 | Hikita et al. | 257/192 |
| 7,989,816 | B2* | 8/2011 | Sato | 257/73 |
| 8,035,130 | B2* | 10/2011 | Nanjo et al. | 257/194 |
| 8,164,115 | B2* | 4/2012 | Hikita et al. | 257/192 |
| 2003/0098462 | A1 | 5/2003 | Yoshida | |
| 2003/0183844 | A1 | 10/2003 | Yokoyama et al. | |
| 2003/0209762 | A1* | 11/2003 | Nishii et al. | 257/347 |

(Continued)

FOREIGN PATENT DOCUMENTS

| JP | 2000-164926 A | 6/2000 |
| JP | 2003-229439 A | 8/2003 |

(Continued)

OTHER PUBLICATIONS

International Search Report issued in International Patent Application No. PCT/JP2010/002981 dated Jul. 20, 2010.

*Primary Examiner* — Caleb Henry
(74) *Attorney, Agent, or Firm* — McDermott Will & Emery LLP (57) ABSTRACT A nitride semiconductor device includes a semiconductor multilayer formed on a substrate, a first ohmic electrode and a Schottky electrode spaced apart from each other on the semiconductor multilayer; and a passivation film covering a top of the semiconductor multilayer. The semiconductor multilayer 102 includes a first nitride semiconductor layer, a second nitride semiconductor layer, and a p-type third nitride semiconductor layer 124 sequentially formed on the substrate. The third nitride semiconductor layer contains p-type impurities, and is selectively formed between the first ohmic electrode and the Schottky electrode in contact with the Schottky electrode.

7 Claims, 8 Drawing Sheets

(56) References Cited

U.S. PATENT DOCUMENTS

| | | | |
|---|---|---|---|
| 2004/0227211 A1* | 11/2004 | Saito et al. ............... 257/578 |
| 2005/0045892 A1* | 3/2005 | Hayashi et al. ............ 257/77 |
| 2005/0110042 A1 | 5/2005 | Saito et al. |
| 2005/0173728 A1* | 8/2005 | Saxler ...................... 257/192 |
| 2005/0189562 A1* | 9/2005 | Kinzer et al. .............. 257/192 |
| 2006/0060871 A1* | 3/2006 | Beach ....................... 257/94 |
| 2006/0175633 A1* | 8/2006 | Kinzer ...................... 257/192 |
| 2006/0197106 A1* | 9/2006 | Mizutani ................... 257/192 |
| 2006/0273347 A1* | 12/2006 | Hikita et al. .............. 257/192 |
| 2007/0120335 A1 | 5/2007 | Birdsell et al. |
| 2007/0158692 A1* | 7/2007 | Nakayama et al. ....... 257/213 |
| 2007/0176215 A1* | 8/2007 | Yanagihara et al. ...... 257/288 |
| 2007/0187717 A1* | 8/2007 | Sadaka et al. ............ 257/192 |
| 2007/0228415 A1* | 10/2007 | Kanamura et al. ....... 257/192 |
| 2007/0249119 A1* | 10/2007 | Saito ........................ 438/253 |
| 2007/0278507 A1* | 12/2007 | Nakazawa et al. ....... 257/94 |
| 2007/0278521 A1* | 12/2007 | Ishida et al. ............. 257/192 |
| 2007/0295990 A1* | 12/2007 | Higashiwaki ............ 257/192 |
| 2008/0054300 A1* | 3/2008 | Nikkel et al. ............ 257/192 |
| 2008/0079023 A1* | 4/2008 | Hikita et al. ............. 257/192 |
| 2008/0087915 A1* | 4/2008 | Uemoto et al. ........... 257/192 |
| 2008/0149940 A1 | 6/2008 | Shibata et al. |
| 2008/0237639 A1* | 10/2008 | Nanjo et al. ............. 257/194 |
| 2009/0121775 A1* | 5/2009 | Ueda et al. ............... 327/427 |
| 2009/0146182 A1* | 6/2009 | Hikita et al. ............. 257/190 |
| 2009/0194791 A1* | 8/2009 | Kanamura ................ 257/192 |
| 2009/0212325 A1* | 8/2009 | Sato ........................ 257/192 |
| 2009/0212326 A1* | 8/2009 | Sato ........................ 257/192 |
| 2009/0278172 A1* | 11/2009 | Kaya et al. .............. 257/192 |
| 2009/0315037 A1* | 12/2009 | Kikkawa .................. 257/76 |
| 2009/0321854 A1* | 12/2009 | Ohta et al. ............... 257/411 |
| 2010/0012924 A1* | 1/2010 | Teraguchi ................ 257/24 |
| 2010/0078683 A1* | 4/2010 | Baba et al. ............... 257/192 |
| 2010/0148184 A1* | 6/2010 | Takehiko et al. ........ 257/76 |
| 2010/0187570 A1* | 7/2010 | Saxler et al. ............. 257/192 |
| 2010/0224910 A1* | 9/2010 | Ando et al. .............. 257/192 |
| 2010/0244097 A1* | 9/2010 | Niiyama et al. .......... 257/192 |
| 2010/0314663 A1* | 12/2010 | Ito et al. .................. 257/192 |
| 2011/0049569 A1* | 3/2011 | He ........................... 257/192 |
| 2012/0074426 A1* | 3/2012 | Ohki et al. ............... 257/76 |

FOREIGN PATENT DOCUMENTS

| | | |
|---|---|---|
| JP | 2005-317843 A | 11/2005 |
| JP | 2007-134608 A | 5/2007 |
| JP | 2008-166639 A | 7/2008 |
| JP | 2009-272441 A | 11/2009 |

* cited by examiner

NITRIDE SEMICONDUCTOR DEVICE

CROSS-REFERENCE TO RELATED APPLICATION

This is a divisional of U.S. patent application Ser. No 13/372,065, filed on Feb. 13, 2012, which is a continuation of PCT International Application PCT/JP2010/002981, filed on Apr. 26, 2010, which claims priority to Japanese Patent Application No. 2009-203978, filed on Sep. 3, 2009. The disclosures of these applications including the specifications, the drawings, and the claims are hereby incorporated by reference in their entirety.

BACKGROUND

The present disclosure relates to nitride semiconductor devices, and more particularly to nitride semiconductor devices which can be used as power devices in power supply circuits etc.

Nitride semiconductors represented by gallium nitride (GaN) are wide gap semiconductors. For example, GaN has a bandgap of 3.4 eV at room temperature. Aluminum nitride (AlN) has a bandgap of 6.2 eV at room temperature. Also, nitride semiconductors have high breakdown field strength and high saturated drift velocity of electrons, as compared to compound semiconductors such as gallium arsenide (GaAs) etc., or silicon (Si) semiconductors, etc. In a heterostructure (AlGaN/GaN heterostructure) of aluminum gallium nitride (AlGaN) and GaN, charges are generated at a heterointerface due to spontaneous polarization and piezoelectric polarization. A sheet carrier concentration of $1 \times 10^{13}$ cm$^{-2}$ or more is obtained even when AlGaN and GaN are undoped. A diode and a hetero-junction field effect transistor (HFET) having high current density can be provided by utilizing two-dimensional electron gas (2DEG) generated at the heterointerface. Therefore, power devices etc. made of nitride semiconductor which is advantageous in increasing output power and a breakdown voltage are now being actively researched and developed.

A Schottky diode is one type of diode used as a power device. A Schottky diode having an AlGaN/GaN heterostructure operates with a large current and low resistance, since two-dimensional electron gas generated at the interface between an undoped AlGaN layer and an undoped GaN layer is used as a channel. In general, a Schottky diode has excellent switching characteristics and a low forward threshold voltage as advantages. A disadvantage is, however, that a reverse leakage current is large.

In order to reduce a reverse leakage current of a Schottky diode, a method, in which two types of metal are used for an anode electrode, and the metal with a higher Schottky barrier is formed to cover the metal with a lower Schottky barrier, is suggested. (See, for example, Japanese Patent Publication No. 2005-317843). When a forward-direction voltage is applied to the diode, a current flows to the metal with the lower Schottky barrier, and a low threshold voltage can be thus maintained. On the other hand, when a reverse-direction voltage is applied to turn the diode off, the metal with the higher Schottky barrier reduces the reverse leakage current.

A passivation film is usually formed on a surface of a device as a surface protection film. The formation of the passivation film provides the advantages of reducing formation of a surface state and reducing the phenomenon called "current collapse" of reduction in a forward current. Since it has also the function of protecting the device from impurities, the passivation film needs to be formed in view of improving reliability of the device.

SUMMARY

However, the present inventors found the problem that reverse leakage currents of a diode largely increase if a passivation film is formed. This may be because a leakage path is formed at the interface between the passivation film and an undoped AlGaN layer. When the leakage path is formed at the interface between the passivation film and the undoped AlGaN layer, reverse leakage currents cannot be reduced, even if the structure of an anode electrode is innovated. Not only a diode, but also a hetero-junction field effect transistor (HFET) etc. have a similar problem. Based on the findings of the present inventors, it is an objective of the present disclosure to provide a nitride semiconductor device with reduced interface leakage currents even when a passivation film is formed.

In order to achieve the objective, the present disclosure provides a nitride semiconductor device including a p-type nitride semiconductor layer formed between a Schottky electrode and an ohmic electrode in contact with the Schottky electrode.

Specifically, an example nitride semiconductor device includes a semiconductor multilayer including at least one first nitride semiconductor layer formed on a substrate, at least one second nitride semiconductor layer formed on the first nitride semiconductor layer, and having a wider bandgap than the first nitride semiconductor layer, and a p-type third nitride semiconductor layer selectively formed on the second nitride semiconductor layer; a first ohmic electrode and a Schottky electrode spaced apart from each other on the semiconductor multilayer; and a passivation film covering a top of the semiconductor multilayer. The third nitride semiconductor layer is formed between the first ohmic electrode and the Schottky electrode in contact with the second nitride semiconductor layer and the Schottky electrode.

In the example nitride semiconductor device, the third nitride semiconductor layer is formed between the first ohmic electrode and the Schottky electrode in contact with the second nitride semiconductor layer and the Schottky electrode. Thus, the leakage path appearing at the interface between the semiconductor multilayer and the passivation film is blocked by the third nitride semiconductor layer. In addition, Schottky leakage can be reduced, since a depletion layer expands from the third nitride semiconductor layer. Thus, even when the passivation film is formed, leakage currents can be largely reduced as compared to a conventional nitride semiconductor device. On the other hand, when a forward bias voltage is applied, the size of the depletion layer decreases and has little influence on forward characteristics.

In the example nitride semiconductor device, the Schottky electrode may be in contact with at least part of an upper surface of the third nitride semiconductor layer. This structure facilitates alignment when forming the Schottky electrode.

In the example nitride semiconductor device, the second nitride semiconductor layer may include a raised portion with a greater thickness than the other portions of the second nitride semiconductor layer. The third nitride semiconductor layer may be formed on the raised portion. This structure mitigates reduction in the third nitride semiconductor layer.

In the example nitride semiconductor device, the first ohmic electrode may be a cathode electrode. The Schottky electrode may be an anode electrode.

In the example nitride semiconductor device, a bottom end of the anode electrode is lower than an interface between the first nitride semiconductor layer and the second nitride semiconductor layer.

The example nitride semiconductor device may further include multiple ones of the at least one first nitride semiconductor layer, and multiple ones of the at least one second nitride semiconductor layer. The first nitride semiconductor layers and the second nitride semiconductor layers may be alternately formed. In this case, a bottom end of the anode electrode may be lower than an interface between a lowermost one of the first nitride semiconductor layers and a lowermost one of the second nitride semiconductor layers.

In the example nitride semiconductor device, the anode electrode may include a plurality of anode fingers connected in parallel to each other. The cathode electrode includes a plurality of cathode fingers connected in parallel to each other. The anode fingers and the cathode fingers may be alternately formed.

In this case, the third nitride semiconductor layer may surround each of the plurality of anode fingers. Also, the third nitride semiconductor layer may discontinuously surround each of the plurality of anode fingers.

The example nitride semiconductor device may further include a second ohmic electrode located opposite to the first ohmic electrode relative to the Schottky electrode. The first ohmic electrode may be a drain electrode. The second ohmic electrode may be a source electrode. The Schottky electrode may be a gate electrode.

In the example nitride semiconductor device, the second nitride semiconductor layer may include a recess portion formed between the drain electrode and the source electrode. The gate electrode may be formed to fill the recess portion.

In the example nitride semiconductor device, the second nitride semiconductor layer may include a recess portion formed between the drain electrode and the source electrode. The gate electrode and the third nitride semiconductor layer may be formed in the recess portion.

In the example nitride semiconductor device, the third nitride semiconductor layer may be formed to surround the gate electrode.

In the example nitride semiconductor device, the source electrode may include a plurality of source electrode fingers connected in parallel to each other. The drain electrode may include a plurality of drain electrode fingers connected in parallel to each other. The gate electrode may include a plurality of gate electrode fingers connected in parallel to each other. The source electrode fingers and the drain electrode fingers are alternately formed. The gate electrode fingers are formed between the source electrode fingers and the drain electrode fingers.

In this case, the third nitride semiconductor layer may surround each of the plurality of gate electrode fingers. Also, the third nitride semiconductor layer may discontinuously surround the gate electrode fingers.

According to the present disclosure, a nitride semiconductor device with a low leakage current can be provided.

BRIEF DESCRIPTION OF THE DRAWINGS

FIGS. 7A-7C illustrate a variation of the nitride semiconductor device according to the embodiment.

FIGS. 13A-13C illustrate a variation of the nitride semiconductor device according to the embodiment.

DETAILED DESCRIPTION

In the present disclosure, AlGaN represents ternary compound $Al_xGa_{1-x}N$, where $0 \leq x \leq 1$. Multi-element mixed crystal compounds are expressed simply by the arrangement of chemical symbols such as AlInN, GaInN, etc. For example, nitride semiconductor $Al_xGa_{1-x-y}In_yN$, where $0 \leq x \leq 1$, $0 \leq y \leq 1$, and $x+y \leq 1$, is expressed simply by AlGaInN. The wording "undoped" means that impurities are not intentionally introduced.

First Embodiment

Figure 1:
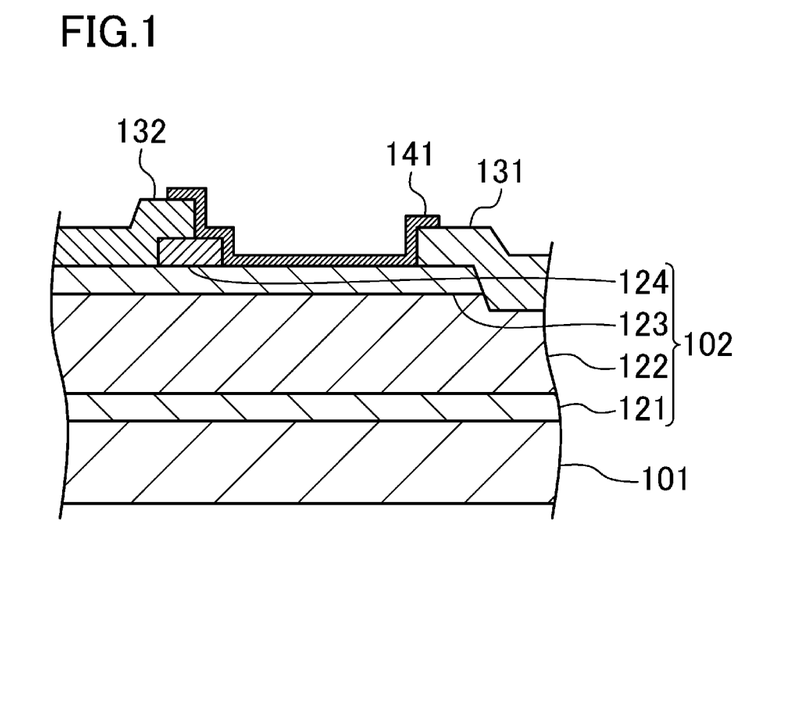
FIG. 1 is a cross-sectional view illustrating a nitride semiconductor device according to an embodiment.

FIG. 1 illustrates a cross-sectional structure of a nitride semiconductor device according to an embodiment. As shown in FIG. 1, the nitride semiconductor device of this embodiment is a Schottky diode. A semiconductor multilayer 102 made of nitride semiconductor is formed on a substrate 101. The semiconductor multilayer 102 includes a buffer layer 121, a first nitride semiconductor layer 122 formed on the buffer layer 121, a second nitride semiconductor layer 123 formed on the first nitride semiconductor layer 122, and a third nitride semiconductor layer 124 selectively formed on the second nitride semiconductor layer 123. The buffer layer 121 may be made of MN etc. with a thickness of about 2 µm. The thickness and the material of the buffer layer 121 may be changed as appropriate according to the type of the substrate 101. Alternatively, the buffer layer 121 may not be formed depending on the type of the substrate. The first nitride semiconductor layer 122 may be made of undoped GaN with a thickness of about 3 µm. The second nitride semiconductor layer may be made of undoped AlGaN with a thickness of about 25 nm The third nitride semiconductor layer may be selectively formed on the second nitride semiconductor layer 123 and made of p-type AlGaN with a thickness of about 200 nm A cathode electrode 131 being an ohmic electrode and an anode electrode 132 being a Schottky electrode are formed on the semiconductor multilayer 102. The cathode electrode 131 is formed of a multilayer film of, for example, titanium and aluminum. The cathode electrode 131 is formed in a recess portion, which reaches a lower position than the interface between the second nitride semiconductor layer 123 and the first nitride semiconductor layer 122 in direct contact with a 2DEG layer. The cathode electrode 131 is spaced apart from the third nitride semiconductor layer 124. If an ohmic contact can be formed with the 2DEG layer, there is no need to form any recess portion. The anode electrode 132 is formed on the second nitride semiconductor layer 123 and made of Schottky metal. The anode electrode 132 is in contact with a side surface of the third nitride semiconductor layer 124 located opposite to the cathode electrode 131. The Schottky metal may be, for example, nickel (Ni), palladium (Pd), or gold (Au). The Schottky metal may be formed of a multilayer of two or more of these materials.

The semiconductor multilayer 102 is covered by a passivation film 141 made of silicon nitride (SiN) etc. In a conventional Schottky diode, when a passivation film is formed, a leakage current caused when a reverse bias voltage has been applied increases by about 3 digits as compared to the case where no passivation film is formed. This may be because a leakage path occurs at the interface between the passivation film and the semiconductor multilayer. However, in the semiconductor device of this embodiment, the anode electrode 132 is located opposite to the cathode electrode 131 relative to the p-type third nitride semiconductor layer 124. The anode electrode 132 is in contact with the third nitride semiconductor layer 124. Therefore, in the semiconductor device of this embodiment, a leakage current at the time of applying a reverse bias voltage can be maintained low, even when the passivation film 141 is formed.

Since the p-type third nitride semiconductor layer 124 servers as a potential barrier, the leakage path appearing at the interface between the passivation film 141 and the second nitride semiconductor layer 123 is blocked by the third nitride semiconductor layer 124. This largely reduces leakage currents flowing through the interface between the passivation film 141 and the second nitride semiconductor layer 123. A depletion layer expands below the third nitride semiconductor layer 124. The 2DEG layer is narrowed and leakage currents at a Schottky junction can be reduced. As a result, in the nitride semiconductor device of this embodiment, the leakage currents can be reduced by about 4 digits as compared to a conventional nitride semiconductor device including a passivation film.

By forming the third nitride semiconductor layer 124, the breakdown voltage rises as compared to a conventional nitride semiconductor device. This may be because the third nitride semiconductor layer 124 serves as a field plate to reduce electric field concentration at the Schottky junction.

On the other hand, when a forward bias voltage is applied to a Schottky diode, the area of the depletion layer decreases, and the forward current flows to the Schottky junction. Thus, the forward characteristics hardly changes as compared to the case where the third nitride semiconductor layer 124 is not formed.

In this embodiment, the anode electrode 132 is formed to cover part of the upper surface of the third nitride semiconductor layer 124. As such, if the anode electrode 132 is formed to overlap the third nitride semiconductor layer 124, alignment is facilitated. However, the anode electrode 132 may have any structure as long as it is located opposite to the cathode electrode 131 relative to the third nitride semiconductor layer 124, and the third nitride semiconductor layer 124 has potential equal to that of the anode electrode 132. However, it is not preferable that the third nitride semiconductor layer 124 be in contact with the cathode electrode 131, since a current flows to the third nitride semiconductor layer 124.

Figure 2:
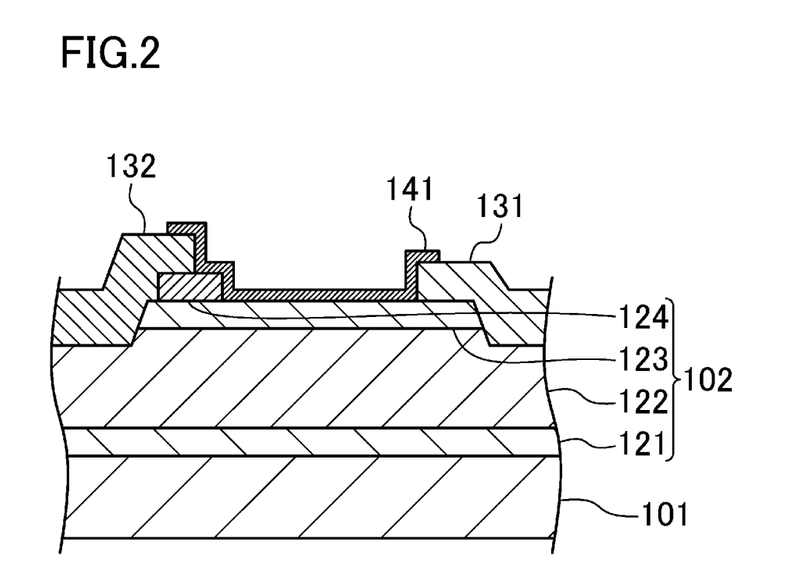
FIG. 2 is a cross-sectional view illustrating a variation of the nitride semiconductor device according to the embodiment.

The anode electrode 132 is formed on the second nitride semiconductor layer 123. However, as shown in FIG. 2, a recess portion may be formed to reach a lower position than the interface between the second nitride semiconductor layer 123 and the first nitride semiconductor layer 122, and the anode electrode 132 may be formed in the recess portion. This structure improves forward characteristics, since the Schottky metal is in direct contact with the 2DEG layer.

Figure 3:
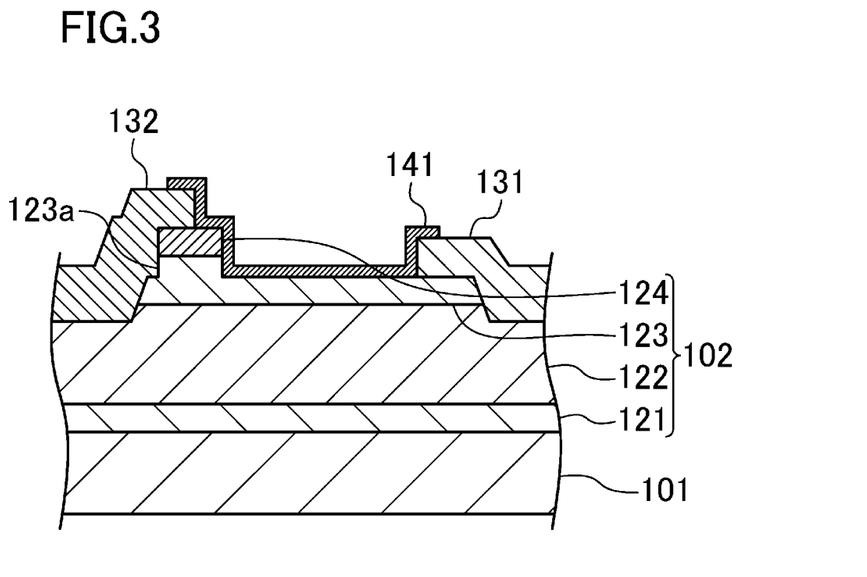
FIG. 3 is a cross-sectional view illustrating a variation of the nitride semiconductor device according to the embodiment.

An example has been described where the second nitride semiconductor layer 123 has a uniform thickness. As shown in FIG. 3, however, a raised portion 123a with a greater thickness than the other portions may be formed in the second nitride semiconductor layer 123, and the third nitride semiconductor layer 124 may be formed on the raised portion 123a. The carrier concentration of the 2DEG layer may decrease due to raising of the conduction band directly under the portion where the p-type third nitride semiconductor layer 124 is formed. By increasing the thickness of the second nitride semiconductor layer 123 directly under the third nitride semiconductor layer 124, a decrease in the carrier concentration of the 2DEG layer due to the third nitride semiconductor layer 124 can be compensated and on-resistance can be reduced. When the second nitride semiconductor layer 123 made of AlGaN is formed, the thickness is generally about 25 nm In this case, the thickness directly under the third nitride semiconductor layer 124 may range from about 30 nm to about 45 nm This structure may be combined with the structure of the anode electrode 132 formed in the recess portion.

Figure 4:
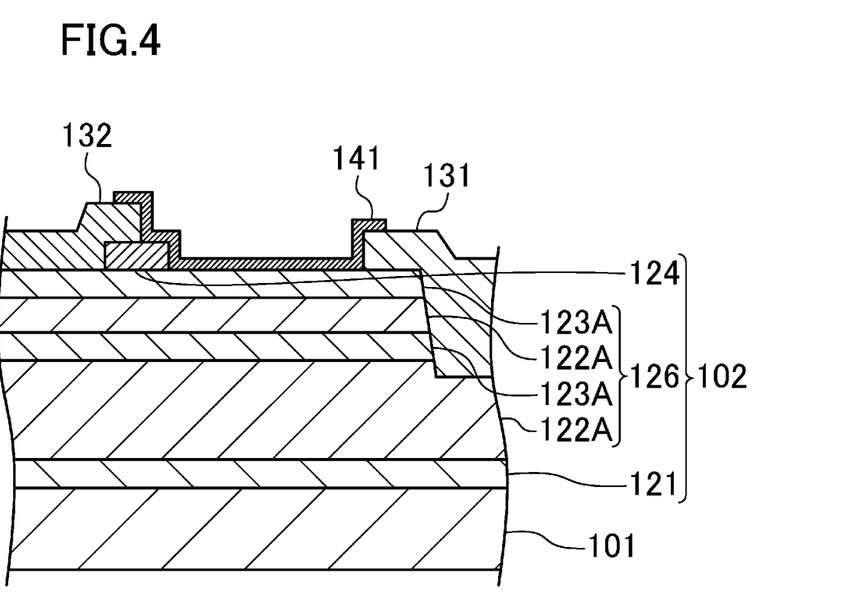
FIG. 4 is a cross-sectional view illustrating a variation of the nitride semiconductor device according to the embodiment.

As shown in FIG. 4, the semiconductor multilayer 102 may include a multi-channel layer 126 formed by alternately stacking first nitride semiconductor layers 122A made of undoped GaN and second nitride semiconductor layers 123A made of undoped AlGaN.

Figure 5:
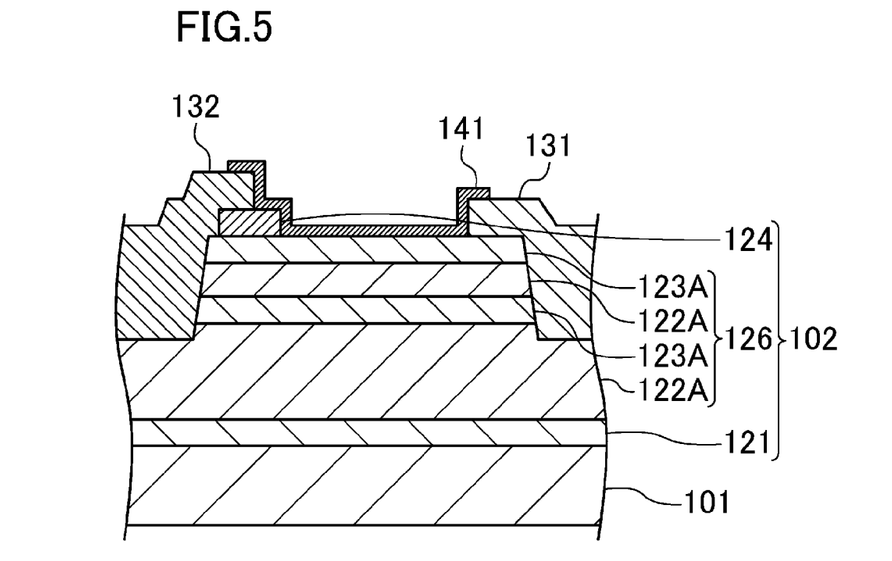
FIG. 5 is a cross-sectional view illustrating a variation of the nitride semiconductor device according to the embodiment.
Figure 6:
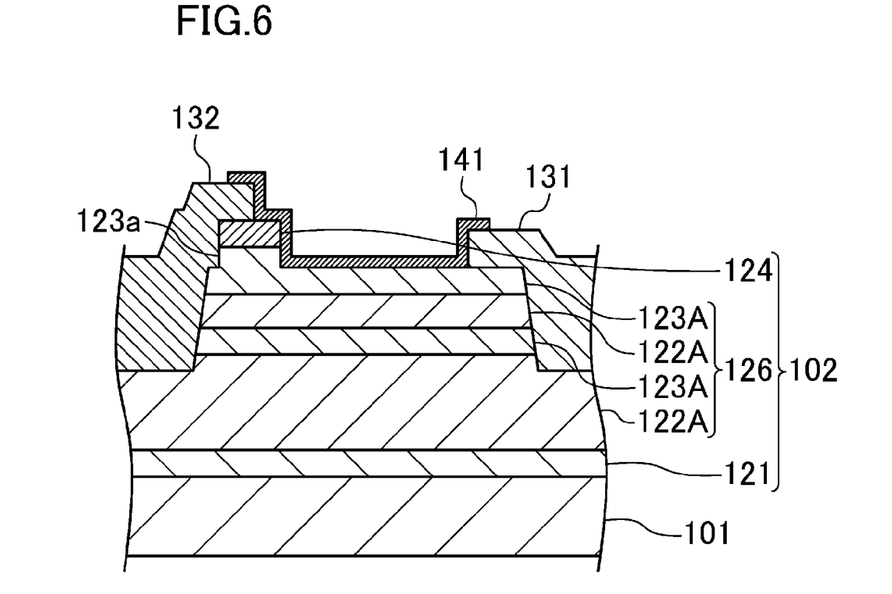
FIG. 6 is a cross-sectional view illustrating a variation of the nitride semiconductor device according to the embodiment.

When the multi-channel layer 126 is formed, the 2DEG layer serving as a channel is generated near the interface between the first nitride semiconductor layer 122A and the second nitride semiconductor layer 123A in each of the first nitride semiconductor layers 122A. Since a plurality of channels are provided, on-resistance can be largely reduced. In this case as well, as shown in FIG. 5, the anode electrode 132 may be formed in the recess portion and may be in direct contact with the 2DEG layers. Also, as shown in FIG. 6, in the uppermost second nitride semiconductor layer 123A, a raised portion 123a with a greater thickness than the other portions may be formed directly under the portion where the p-type third nitride semiconductor layer 124 is formed. While in FIGS. 4-6, two cycles of the first nitride semiconductor layers 122A and the second nitride semiconductor layers 123A are provided, three or more cycles may be stacked.

Figure 7A:
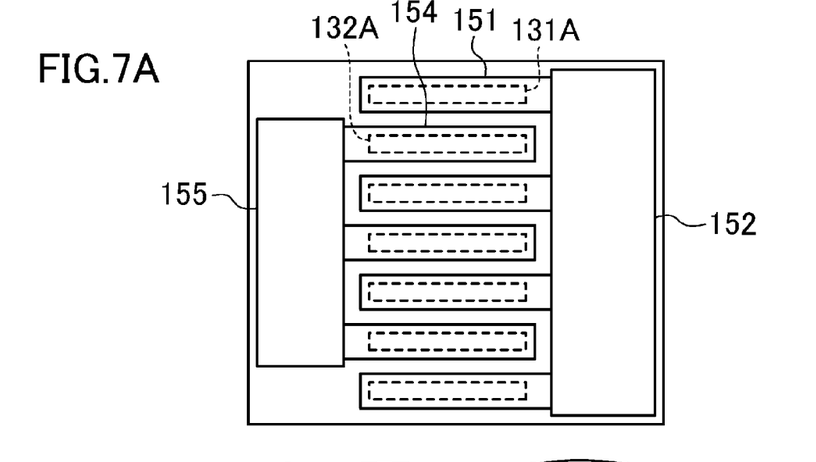
FIG. 7A is a top view.
Figure 7B:
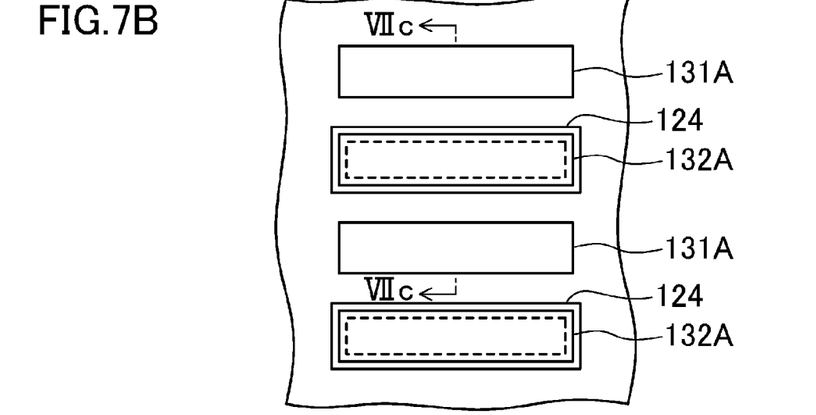
FIG. 7B is an enlarged top view illustrating part of FIG. 7A.
Figure 7C:
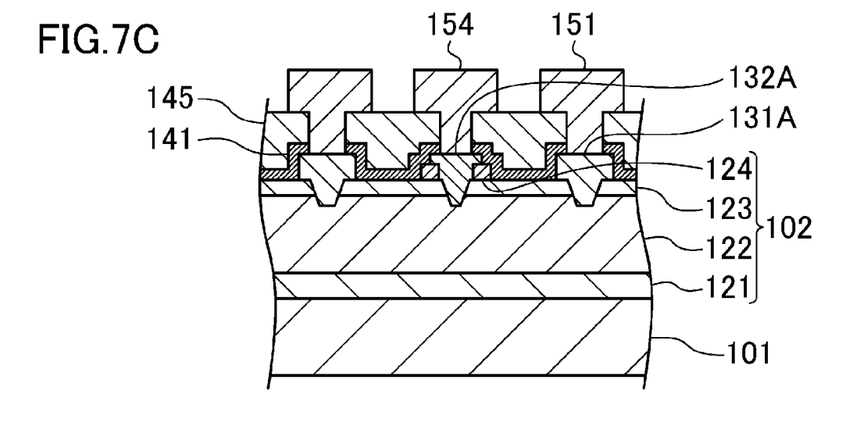
FIG. 7C is a cross-sectional view taken along the line VIIc-VIIc of FIG. 7B.

As shown in FIGS. 7A-7C, a multi-finger type diode may be formed, in which a plurality of cathode electrode fingers 131A and a plurality of anode electrode fingers 132A are alternately arranged. FIG. 7A illustrates the entire structure viewed from above. FIG. 7B is an enlarged top view of the structures of the cathode electrode fingers 131A and the anode electrode fingers 132A. FIG. 7C illustrates a cross-sectional structure taken along the line VIIc-VIIc of FIG. 7B. In FIG. 7B, the passivation film 141, an interlayer insulating film 145, cathode interconnects 151, and anode interconnects 154 are not shown.

The cathode electrode fingers 131A are connected to a cathode pad 152 by the cathode interconnects 151 formed on the interlayer insulating film 145. The anode electrode fingers 132A are connected to an anode pad 155 by the anode interconnects 154.

Figure 8:
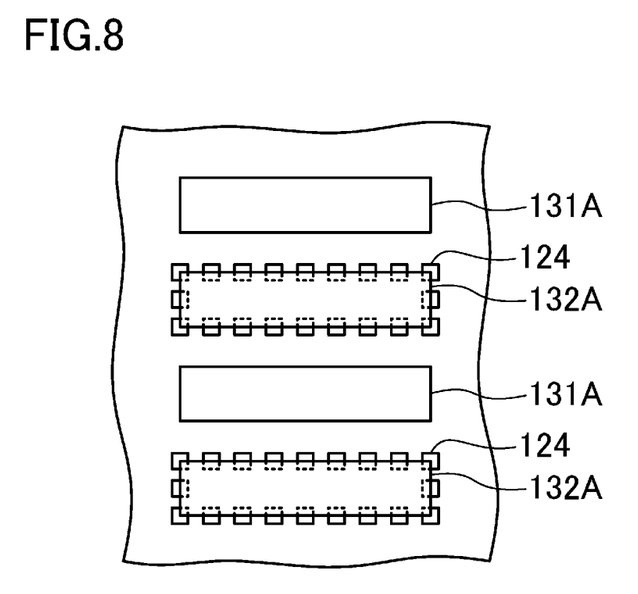
FIG. 8 is a top view illustrating a variation of the nitride semiconductor device according to the embodiment.

In FIGS. 7A-7C, the third nitride semiconductor layer 124 is formed to surround each of the anode electrode fingers 132A. The depletion layer expands not only directly under the third nitride semiconductor layer 124, but obliquely downward. Thus, the third nitride semiconductor layer 124 does not necessarily continuously surround each of the anode electrode fingers 132A, but may be discontinuously surround each of the anode electrode fingers 132A as shown in FIG. 8. This mitigates a decrease in the carrier concentration of the 2DEG layer due to the third nitride semiconductor layer 124. The intervals of the parts of the discontinuous third nitride semiconductor layer 124 may be controlled so that the depletion layers overlap each other. In FIGS. 7A-7C, an example has been described where the anode electrode fingers 132A are formed in the recess portion which reaches a lower position than the interface between the second nitride semiconductor layer 123 and the first nitride semiconductor layer 122 similar to FIG. 2. However, the anode electrode fingers 132A may not necessarily include a recess structure. In FIGS. 3-6, a multi-finger type diode may be formed.

Figure 9:
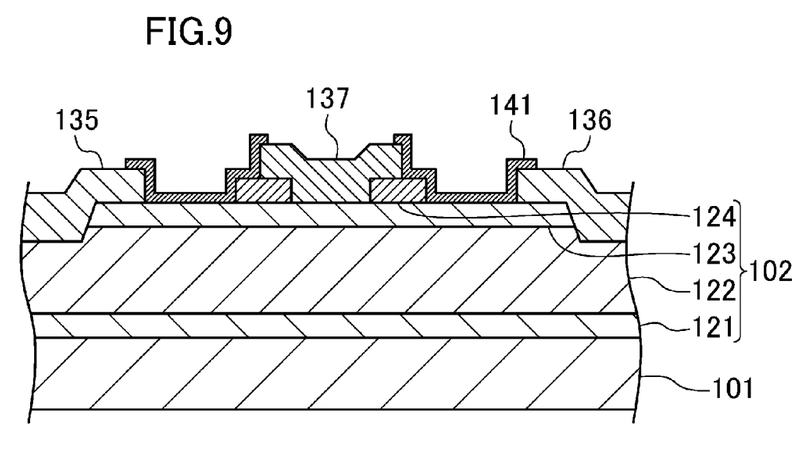
FIG. 9 is a cross-sectional view illustrating a variation of the nitride semiconductor device according to the embodiment.

As shown in FIG. 9, the present disclosure is not limited to a diode but may be implemented as a transistor. In the case of a transistor, a source electrode 135 and a drain electrode 136 may be formed as ohmic electrodes, and a gate electrode 137 may be formed as a Schottky electrode. The third nitride semiconductor layer 124 may be formed to surround the gate electrode 137. This structure reduces leakage currents between the source electrode 135 and the gate electrode 137, and leakage currents between the drain electrode 136 and the gate electrode 137.

Figure 10:
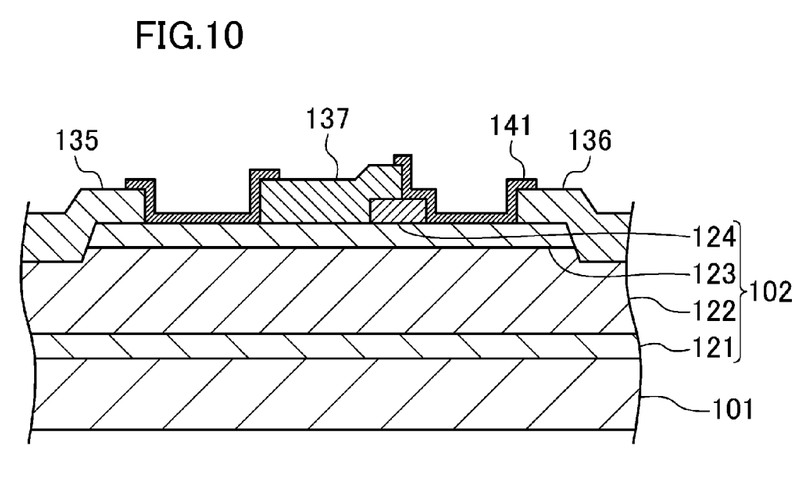
FIG. 10 is a cross-sectional view illustrating a variation of the nitride semiconductor device according to the embodiment.

In the case of a transistor, leakage currents between the drain electrode 136 and the gate electrode 137 have been generally problematic. Thus, as shown in FIG. 10, the third nitride semiconductor layer 124 may not be formed between the gate electrode 137 and the source electrode 135. The second nitride semiconductor layer 123 may have an increased thickness directly under the third nitride semiconductor layer 124.

Figure 11:
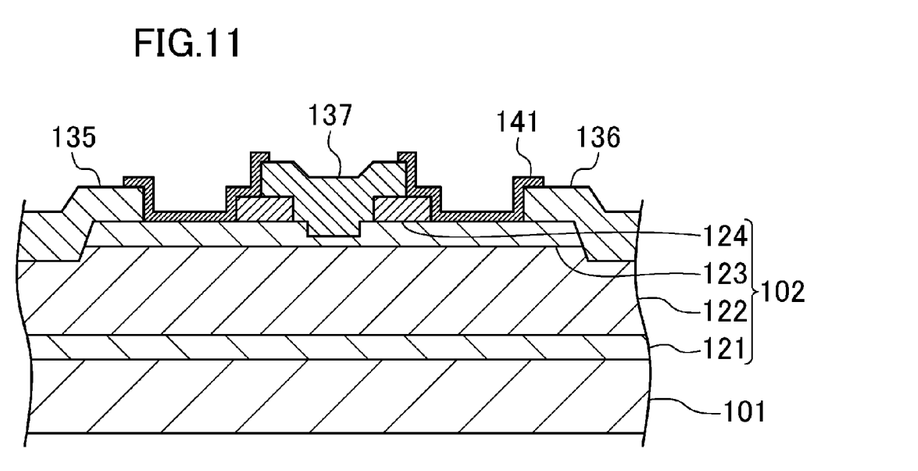
FIG. 11 is a cross-sectional view illustrating a variation of the nitride semiconductor device according to the embodiment.
Figure 12:
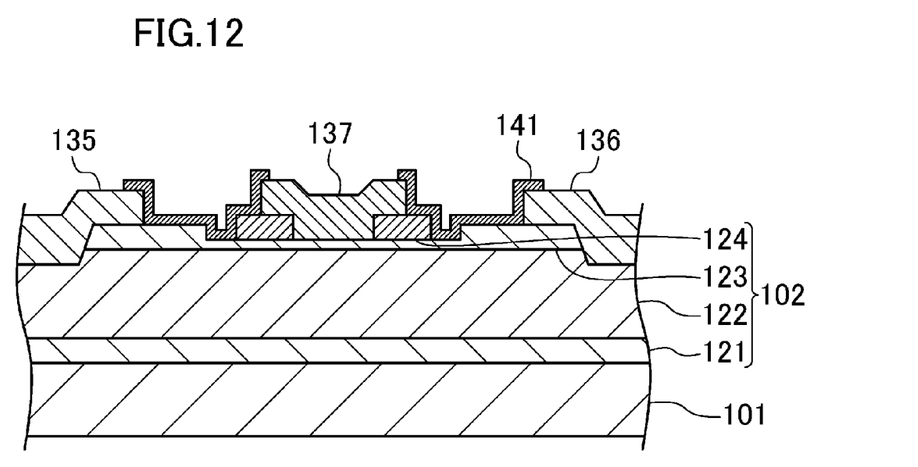
FIG. 12 is a cross-sectional view illustrating a variation of the nitride semiconductor device according to the embodiment.

As shown in FIG. 11, a recess portion may be formed in the second nitride semiconductor layer 123 to be filled by the gate electrode 137. By forming this gate recess structure, current collapse can be reduced and a threshold voltage can be raised. Alternatively, as shown in FIG. 12, a wide recess structure may be formed, in which the gate electrode 137 and the third nitride semiconductor layer 124 are formed in a recess portion. In FIGS. 11 and 12 as well, the third nitride semiconductor layer 124 may not be formed between the source electrode 135 and the gate electrode 137.

Figure 13A:
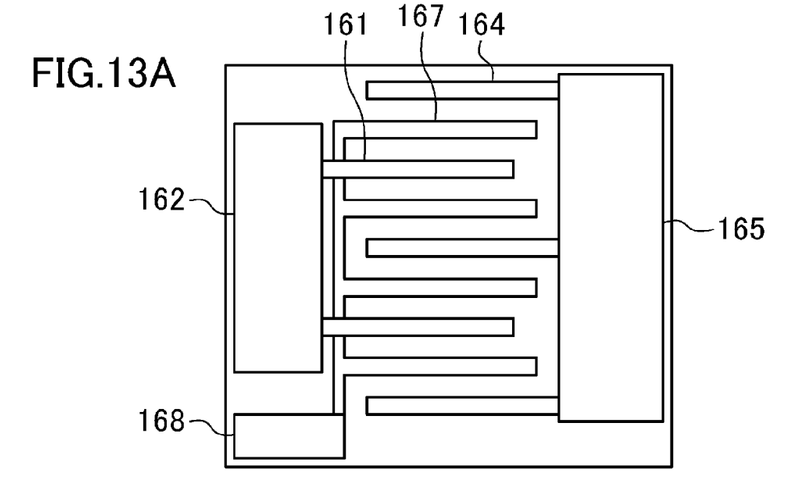
FIG. 13A is a top view.
Figure 13B:
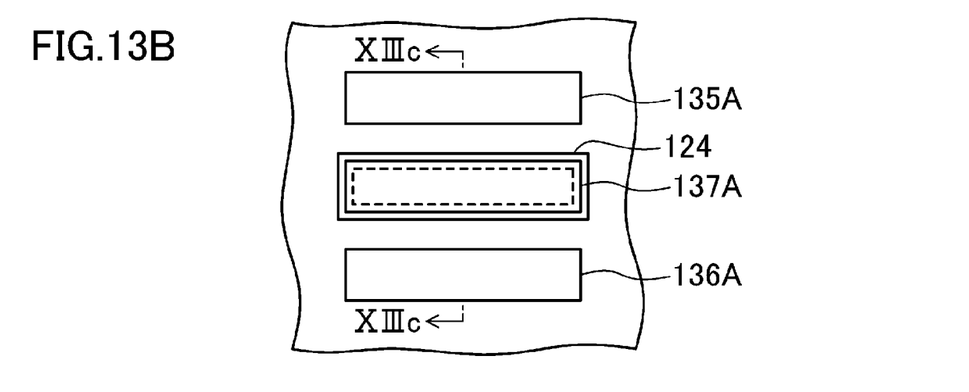
FIG. 13B is an enlarged top view illustrating part of FIG. 13A.
Figure 13C:
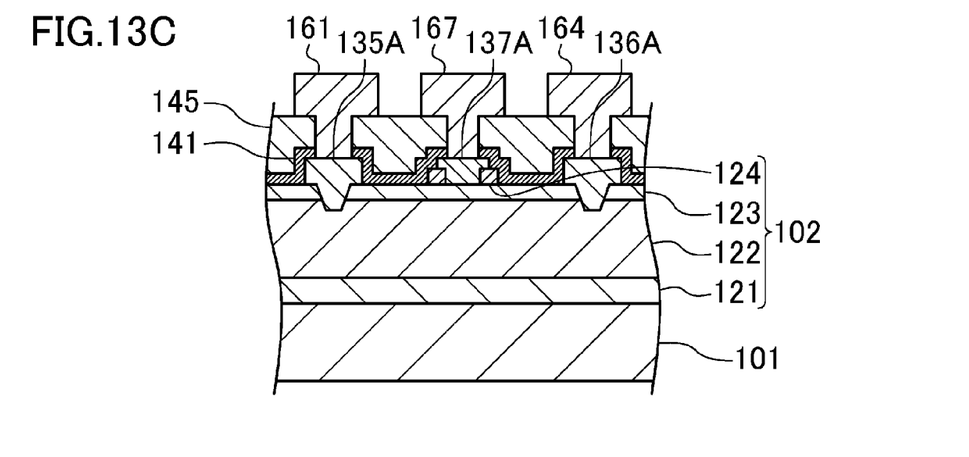
FIG. 13C is a cross-sectional view taken along the line XIIIc-XIIIc of FIG. 13B.

As shown in FIGS. 13A-13C, a multi-finger type transistor may be formed, in which a plurality of source electrode fingers 135A and a plurality of drain electrode fingers 136A are alternately arranged, and gate electrode fingers 137A are formed between the source electrode fingers 135A and the drain electrode fingers 136A. FIG. 13A illustrates the entire structure viewed from above. FIG. 13B is an enlarged top view of the structures of the source electrode fingers 135A, the drain electrode fingers 136A, and the gate electrode fingers 137A. FIG. 13C illustrates a cross-sectional structure taken along the line XIIIc-XIIIc of FIG. 13B. In FIG. 13B, the passivation film 141, the interlayer insulating film 145, source interconnects 161, drain interconnects 164, and gate interconnects 167 are not shown.

The source electrode fingers 135A are connected to a source pad 162 between the source interconnects 161 formed on the interlayer insulating film 145. The drain electrode fingers 136A are connected to a drain pad 165 by the drain interconnects 164. The gate electrode fingers 137A are connected to a gate pad 168 by the gate interconnects 167.

The third nitride semiconductor layer 124 may not be formed by the source electrode fingers 135A and the gate electrode fingers 137A. The third nitride semiconductor layer 124 may not be formed continuously, but may be divided into a plurality of parts which are arranged at predetermined intervals.

The third nitride semiconductor layer may be made of GaN in place of AlGaN as long as it is a p-type nitride semiconductor layer. However, the third nitride semiconductor layer preferably has a narrower bandgap than the second nitride semiconductor layer. Thus, if the third nitride semiconductor layer and the second nitride semiconductor layer are both made of AlGaN, the third nitride semiconductor layer preferably has a lower Al composition ratio than the second nitride semiconductor layer. P-type impurities may be magnesium (Mg) etc. When the impurity concentration is about $1 \times 10^{17}$ cm$^{-3}$ or more, the influence of a leakage path appearing at the interface between the second nitride semiconductor layer and the passivation film can be reduced. In order to effectively reduce the influence of the leakage path, it is preferably about $1 \times 10^{18}$ cm$^{-3}$ or more. However, it may be about $1 \times 10^{20}$ cm$^{-3}$ or less, since the carrier concentration of the 2DEG layer decreases when the third nitride semiconductor layer has a high impurity concentration. In order to reduce the influence on the 2DEG layer, it is preferably about $1 \times 10^{19}$ cm$^{-3}$ or less.

The width of the third nitride semiconductor layer may be determined as appropriate, as long as the influence of the leakage path appearing at the interface between the second nitride semiconductor layer and the passivation film can be reduced. Note that, if the width of the third nitride semiconductor layer is great, the area of the 2DEG layer, which has a reduced carrier concentration, becomes large. On the other hand, if the area is too small, the process margin is lost and the third nitride semiconductor layer is difficult to form. Therefore, the width is preferably about 1 μm.

The first nitride semiconductor layer and the second nitride semiconductor layer may be provided in any combination as long as a 2DEG layer can be formed at the heterojunction interface.

While an example has been described where the passivation film is a SiN film, similar advantages can be provided by a passivation film of other materials. In place of the SiN film, the passivation film may be an MN film, $SiO_2$ film, $Al_2O_3$, etc. The passivation film may be a multilayer film of an MN film and a SiN film etc.

The substrate may be made of silicon (Si), silicon carbide (SiC), gallium arsenide (GaAs), gallium nitride (GaN), zinc oxide (ZnO), sapphire, etc.

According to the present disclosure, a nitride semiconductor device with reduced interface leakage currents is provided even when a passivation film is formed, and is thus particularly useful as a power device etc. in a power supply circuit.

What is claimed is:

1. A nitride semiconductor device comprising:
   a semiconductor multilayer including:
   at least one first nitride semiconductor layer formed on a substrate,
   at least one second nitride semiconductor layer formed on the first nitride semiconductor layer, and having a wider bandgap than the first nitride semiconductor layer, and
   a p-type third nitride semiconductor layer selectively formed on the second nitride semiconductor layer;
   a first ohmic electrode and a Schottky electrode spaced apart from each other on the semiconductor multilayer;
   a second ohmic electrode located opposite to the first ohmic electrode relative to the Schottky electrode; and
   a passivation film covering a top of the semiconductor multilayer, wherein
   the p-type third nitride semiconductor layer is formed between the first ohmic electrode and the Schottky electrode in contact with the second nitride semiconductor layer and the Schottky electrode,
   the first ohmic electrode is a drain electrode,
   the second ohmic electrode is a source electrode,
   the Schottky electrode is a gate electrode, and
   a bottom end of the drain electrode is lower than an interface between the first nitride semiconductor layer and the second nitride semiconductor layer.

2. The nitride semiconductor device of claim 1, wherein
   the second nitride semiconductor layer includes a recess portion formed between the drain electrode and the source electrode, and 3. The nitride semiconductor device of claim 1, wherein
   the second nitride semiconductor layer includes a recess portion formed between the drain electrode and the source electrode, and
   the gate electrode and the third nitride semiconductor layer are formed in the recess portion.

4. The nitride semiconductor device of claim 1, wherein
   the third nitride semiconductor layer is formed to surround the gate electrode.

5. The nitride semiconductor device of claim 1, wherein
   the source electrode includes a plurality of source electrode fingers connected in parallel to each other,
   the drain electrode includes a plurality of drain electrode fingers connected in parallel to each other,
   the gate electrode includes a plurality of gate electrode fingers connected in parallel to each other,
   the source electrode fingers and the drain electrode fingers are alternately formed, and
   the gate electrode fingers are formed between the source electrode fingers and the drain electrode fingers.

6. The nitride semiconductor device of claim 5, wherein
   the third nitride semiconductor layer surrounds each of the plurality of gate electrode fingers.

7. The nitride semiconductor device of claim 6, wherein
   the third nitride semiconductor layer discontinuously surrounds the gate electrode fingers.

* * * * *